United States Patent
Chung et al.

(10) Patent No.: US 10,340,896 B1
(45) Date of Patent: Jul. 2, 2019

(54) ELECTRONIC SYSTEM AND SIGNAL SWITCHING CIRCUIT

(71) Applicant: Wiwynn Corporation, New Taipei (TW)

(72) Inventors: Che-Wei Chung, New Taipei (TW); Chia-Nung Tseng, New Taipei (TW); Yung Jung Du, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 0 days.

(21) Appl. No.: 15/938,472

(22) Filed: Mar. 28, 2018

(30) Foreign Application Priority Data

Feb. 1, 2018 (TW) .............................. 107103629 A (51) Int. Cl.
   *H03K 3/037* (2006.01)
   *G01R 31/317* (2006.01)

(52) U.S. Cl.
   CPC ....... *H03K 3/037* (2013.01); *G01R 31/31722* (2013.01)

(58) Field of Classification Search
   CPC .......................... H03K 3/037; G01R 31/31722
   See application file for complete search history.

(56) References Cited

U.S. PATENT DOCUMENTS 6,971,045 B1 * 11/2005 Deb .................. G01R 31/3172
                                                                714/27
2016/0078824 A1 3/2016 Meador et al.

FOREIGN PATENT DOCUMENTS

TW          201621869 A       6/2016

OTHER PUBLICATIONS

Chinese language Office Action dated Jan. 28, 2019, issued in application No. TW 107103629.

* cited by examiner

*Primary Examiner* — Daniel C Puentes
(74) *Attorney, Agent, or Firm* — McClure, Qualey & Rodack, LLP (57) ABSTRACT

A signal-switching circuit for use in an electronic system is provided. The electronic system includes a plurality of hardware circuits. The signal-switching circuit includes a control circuit and a switch circuit. The control circuit is arranged to receive a trigger signal generated by a trigger circuit of the electronic system, and change a mode signal generated by the control circuit according to the trigger signal. The switch circuit is arranged to electrically connect transmission signals from one of the hardware circuits to a transmission interface of the electronic system according to the mode signal.

8 Claims, 6 Drawing Sheets

ELECTRONIC SYSTEM AND SIGNAL SWITCHING CIRCUIT

CROSS REFERENCE TO RELATED APPLICATIONS

This Application claims priority of Taiwan Patent Application No. 107103629, filed on Feb. 1, 2018, the entirety of which is incorporated by reference herein.

BACKGROUND OF THE INVENTION

Field of the Invention

The invention relates to digital circuits, and, in particular, to an electronic system and a signal-switching circuit capable of switching between multiple operation modes using a single signal.

Description of the Related Art

Storage systems or server systems are usually equipped with various different integrated circuits (ICs), chips, or system-on-chips (SoCs). Using the SoCs as an example, the transmission signals of each SoC can be transmitted to an external connector via a switching circuit (e.g., a switch IC), and, for example, an external test board can be connected to the external connector for testing and usage by the designer. Conventionally, software is used to control the switching circuit to switch between different operation modes. For example, the control interface of one of the SoCs can be used to control the switch circuit via a transmission interface such as a general-purpose input/output (GPIO) interface or a two-wire interface (TWI). However, when the SoC for switching control malfunctions or there are problems with the control firmware, the switch circuit cannot be controlled to switch between different operation modes. That is, the transmission signals of other SoCs cannot be used either. In addition, during the design phase, it is very difficult to find out whether the problem is caused by hardware or software.

Accordingly, there is demand for an electronic system and a signal-switching circuit capable of switching between various different operation modes using a single signal to solve the aforementioned problem.

BRIEF SUMMARY OF THE INVENTION

A detailed description is given in the following embodiments with reference to the accompanying drawings.

In an exemplary embodiment, a signal-switching circuit for use in an electronic system is provided. The electronic system includes a plurality of hardware circuits. The signal-switching circuit includes a control circuit and a switch circuit. The control circuit is arranged to receive a trigger signal generated by a trigger circuit of the electronic system, and change a mode signal generated by the control circuit according to the trigger signal. The switch circuit is arranged to electrically connect transmission signals from one of the hardware circuits to a transmission interface of the electronic system according to the mode signal.

In another exemplary embodiment, an electronic system is provided. The electronic system includes: a plurality of hardware circuits; a trigger circuit, a transmission interface, and a signal-switching circuit. The trigger circuit is arranged for generating a trigger signal. The signal-switching circuit includes: a control circuit and a switch circuit. The control circuit is arranged to receive the trigger signal generated by the trigger circuit and change a mode signal generated by the control circuit according to the trigger signal. The switch circuit is arranged to electrically connect transmission signals from one of the hardware circuits to the transmission interface of the electronic system according to the mode signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
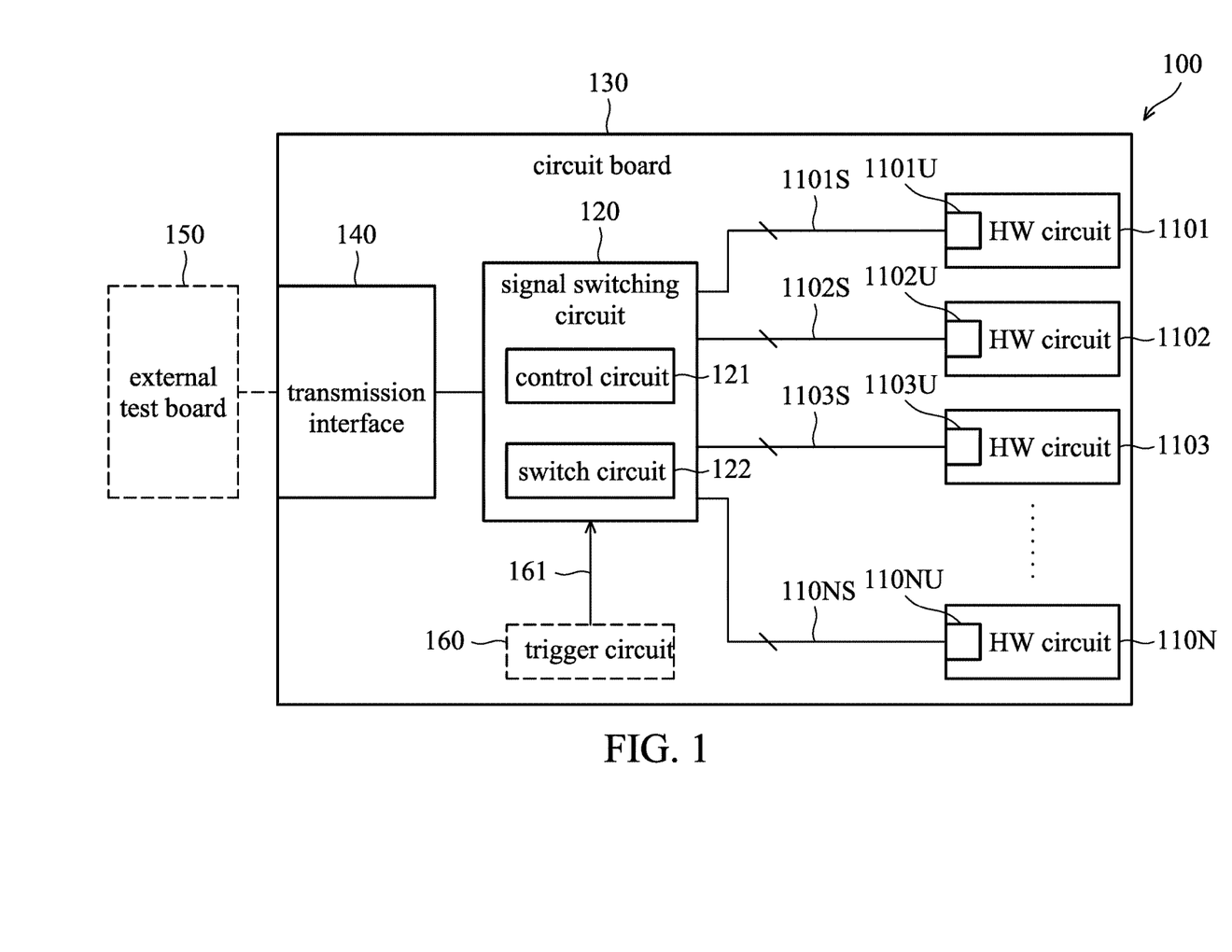
FIG. 1 is a schematic block diagram of an electronic system in accordance with an embodiment of the invention.

FIG. 1 is a schematic block diagram of an electronic system in accordance with an embodiment of the invention.

As illustrated in FIG. 1, the electronic system 100 includes a plurality of hardware circuits 1101~110N, a signal-switching circuit 120, a circuit board 130, and a transmission interface 140. In an embodiment, the circuit board 130 may be a printed circuit board (PCB), and the hardware circuits 1101~110N, the signal-switching circuit 120, and the transmission interface are deployed on the circuit board 130. Each of the hardware circuits 1101~110N may be an integrated circuit (IC), a system-on-chip (SoC), an input/output controller (IOC), a baseboard management controller (BMC), or a processor, but the embodiment of the invention is not limited thereto.

In an embodiment, each of the hardware circuits 1101~110N includes a universal asynchronous receiver/transmitter (UART) such as UARTs 1101U~110NU, wherein each UART may supports standards of the transmission interfaces such as Recommended Standard (RS) 232, RS449, RS423, RS442, or RS485, but the embodiment of the invention is not limited thereto. Each of the UARTs 1101U~110NU is arranged to receive a set of transmission signals from a corresponding hardware circuit of the hardware circuits 1101~110N.

The UART of each of the hardware circuits 1101~110N is electrically connected to the signal-switching circuit 120, and the signal-switching circuit 120 may sequentially switch to a different operation mode according to a trigger signal, where each operation mode corresponds to one of the hardware circuits 1101~110N, and the trigger signal may be a pulse signal. When the signal-switching circuit 120 is switched to a specific operation mode, the signal-switching circuit may connect the set of transmission signals of the hardware circuit corresponding to the specific operation mode to the transmission interface 140, so that the hardware circuit of the specific operation mode can be electrically connected to an external test board 150. In an embodiment, the signal-switching circuit 120 may be a switch IC, but the embodiment of the invention is not limited thereto. The transmission interface 140 may be implemented using a connector.

In an embodiment, the trigger signal 161 received by the signal-switching circuit 120 can be generated by a trigger circuit 160 that is deployed on the circuit board 130. In an alternative embodiment, the trigger circuit 160 can be deployed on the external test board 150 and electrically connected to the signal-switching circuit 120 via the transmission interface 140. For example, the trigger circuit 160 may be implemented using a physical button or a hardware circuit, but the embodiment of the invention is not limited thereto.

For example, if the physical button (not shown) of the trigger circuit 160 is pressed, the trigger circuit 160 will generate the trigger signal 161 that is transmitted to the signal-switching circuit 120, thereby controlling the signal-switching circuit 120 to sequentially switch to a different operation mode, where the details will be described later.

Figure 2:
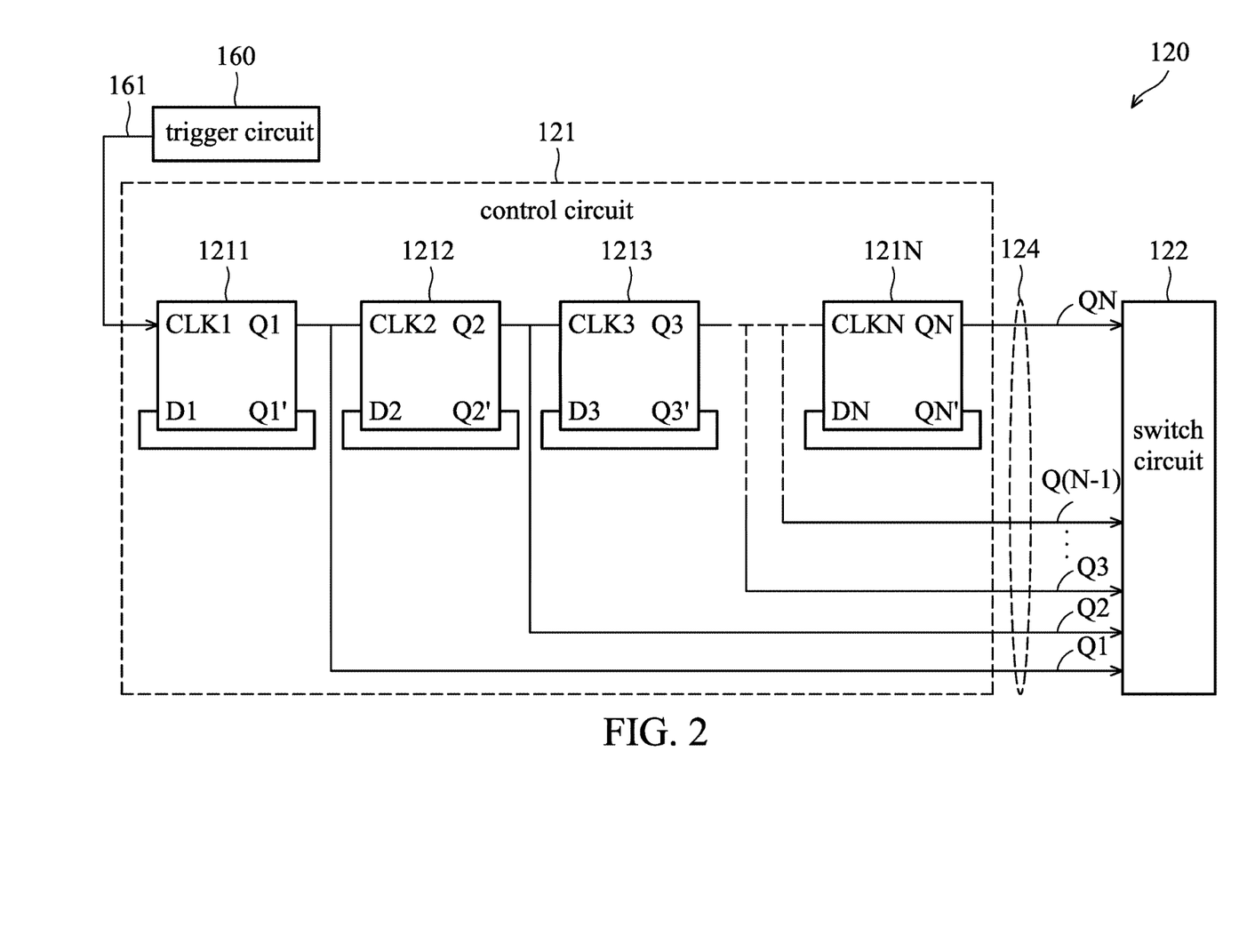
FIG. 2 is a schematic block diagram of the signal-switching circuit in accordance with an embodiment of the invention.

FIG. 2 is a schematic block diagram of the signal-switching circuit in accordance with an embodiment of the invention.

In an embodiment, the operation mode of the signal-switching circuit 120 is determined by the mode signal that is controlled by the trigger signal 161 from the trigger circuit 160. For example, the schematic block diagram of the signal-switching circuit 120 is illustrated in FIG. 2, and the signal-switching circuit 120 includes a control circuit 121 and a switch circuit 122. The control circuit 121 is arranged to receive the trigger signal 161 from the trigger circuit 160, and change the mode signal generated by the control circuit according to the trigger signal 161. The control circuit 121 includes a plurality of serial D flip-flips (DFFs) 1211~121N, and the mode signal includes the output signal of the output pin of each DFFs 1211~121N.

In an embodiment, each of the DFFs 1211~121N may be a positive-edge-triggered DFF, and the DFFs 1211~121N are serially connected in a predetermined way. Each of the DFFs 1211~121N includes a block input pin CLK (or an enable pin EN), a data input pin D, a data output pin Q, and an inverse data output pin Q'. In an alternative embodiment, each of the DFFs 1211~121N may be a negative-edge-triggered DFF. For the purposes of description, the DFFs 1211~121N are positive-edge-triggered DFFs in the following embodiments. The signal-switching circuit 120 in FIG. 2 is a synchronous circuit, and that is, each of the DFFs 1211~121N may receive a positive-edge-triggered signal via its clock input pin CLK to control the data output pin Q.

As illustrated in FIG. 2, the clock input pin CLK1 of the DFF 1211 receives the trigger signal 161 from the trigger circuit 160, and the data output pin Q1 of the DFF 1211 is connected to the clock input pin CLK2 of the DFF 1212. The inverse data output pin Q1' of the DFF 1211 is connected to the data input pin D1 of the DFF 1211.

Similarly, the clock input pin CLK2 of the DFF 1212 receives the signal from the data output pin Q1 of the DFF 1211, and the data output pin Q2 of the DFF 1212 is connected to the clock input pin CLK3 of the DFF 1213. The inverse data output pin Q2' of the DFF 1212 is connected to the data input pin D2 of the DFF 1212. The subsequent DFFs 1213~121N are serially connected is a similar way, and the details will be omitted here. In particular, the data output pin QN of the DFF 121N is directly connected to the switch circuit 122. In addition, the output signals Q1~QN from the DFFs 1211~121N may form the mode signal 124, and the mode signal 124 is transmitted to the switch signal 122 as an input signal for switching between different operation modes.

Briefly, the inverse data output pin is connected to the data input pin for each of the DFF 1211~121N, and the clock input pin CLK1 of the first DFF 1211 receives the trigger signal 161. The data output pin of each of the DFFs from first DFF to (N−1)-th DFF 121(N−1) is connected to the clock input pin of the next DFF. That is, the data output pin Q1 of the first DFF 1211 is connected to the clock input pin CLK2 of the second DFF 1212, and the data output pin Q2 of the second DFF 1212 is connected to the clock input pin CLK3 of the third DFF 1213, and so on. In addition, the data output pin QN of the N-th DFF 121N is connected to the switch circuit 122.

Specifically, the output signals Q1~QN of the DFFs 1211~121N form the mode signal 124. If the number of DFFs is N, $2^N$ operation modes can be obtained. It should be noted that the sequential switching between the $2^N$ operation modes is controlled by a one-bit trigger signal, where the details for controlling switching between the operation modes by the trigger signals will be described in the embodiments of FIG. 3 and FIG. 4.

Figure 3:
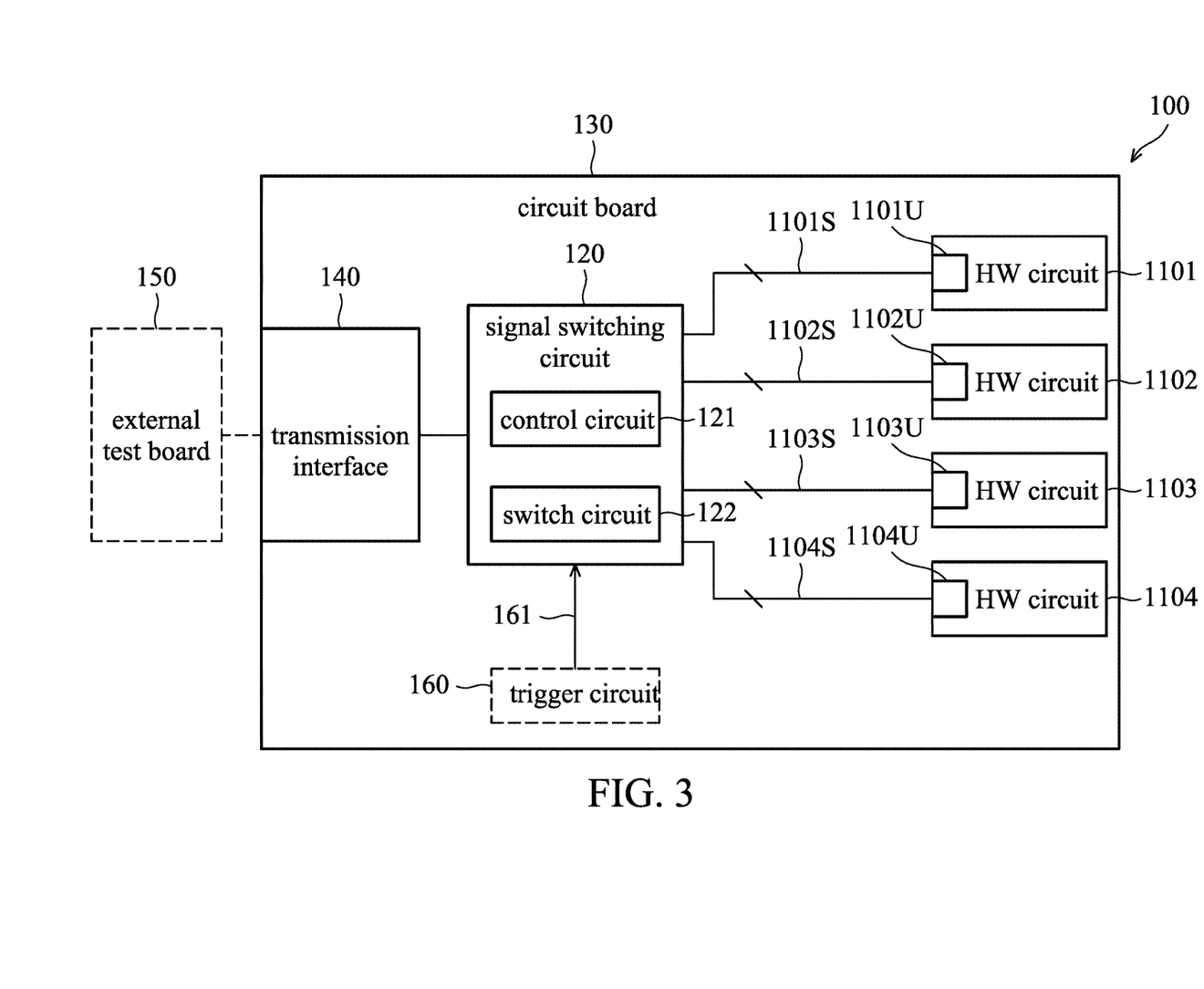
FIG. 3 is a schematic block diagram of an electronic system in accordance with another embodiment of the invention.
Figure 4:
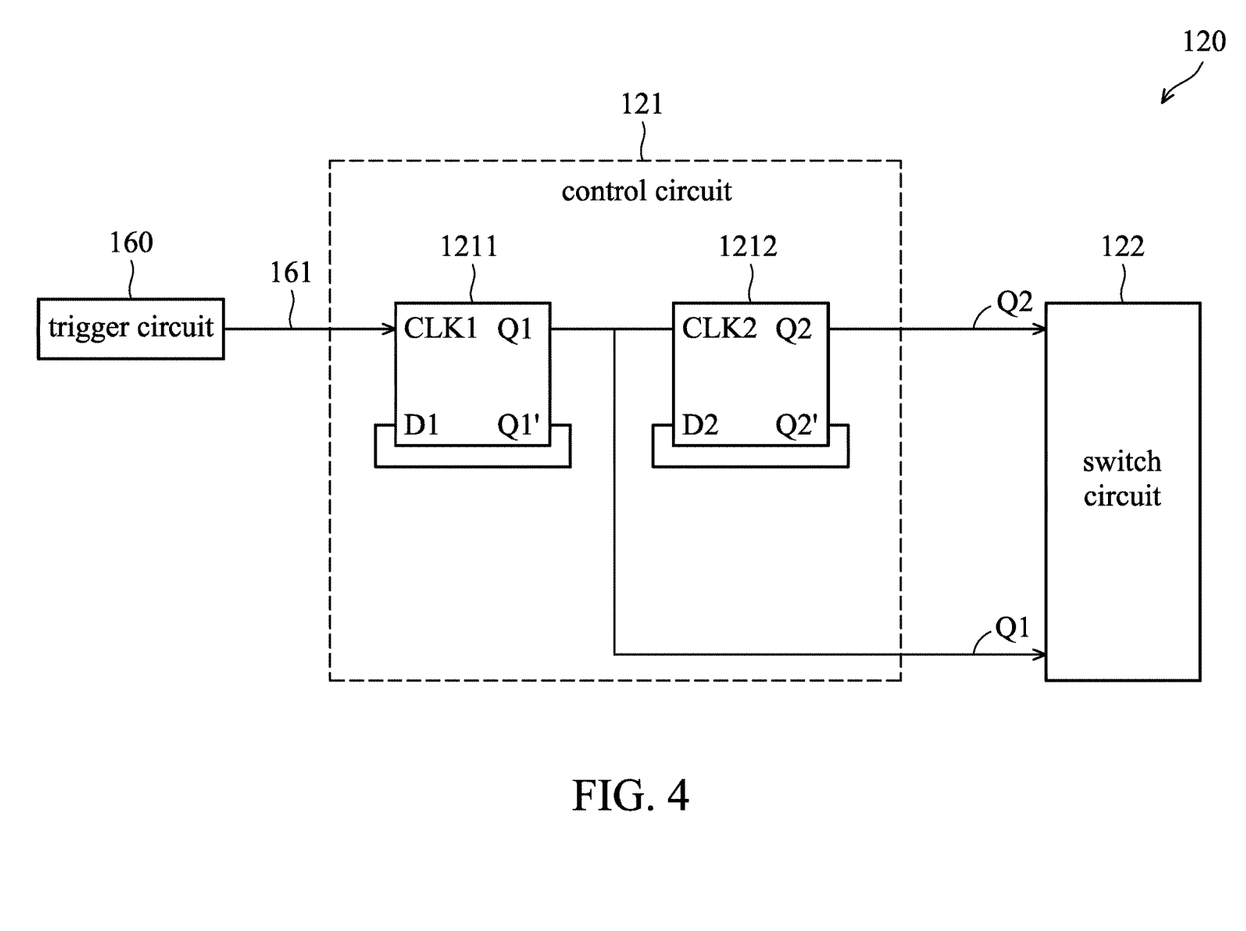
FIG. 4 is a schematic block diagram of the signal-switching circuit in accordance with the embodiment of FIG. 3.

FIG. 3 is a schematic block diagram of an electronic system in accordance with another embodiment of the invention. FIG. 4 is a schematic block diagram of the signal-switching circuit in accordance with the embodiment of FIG. 3.

Referring to FIG. 3 and FIG. 4, in another embodiment, for the purposes of description, the electronic system 100 includes hardware circuits 1101~1104, and the signal-switching circuit 120 includes the DFFs 1211 and 1212. Thus, the mode signal is a 2-bit signal.

In the embodiment, the signal-switching circuit 120 has four operation modes such as a first operation mode, a second operation mode, a third operation mode, and a fourth operation mode that respectively correspond to the mode signals (Q1, Q2) of (1, 1), (0, 1), (1, 0), and (1, 1), wherein 0 indicates a low logic level (L), and 1 indicates a high logic level (H). The relationships between the operation modes and the mode signal (Q1, Q2) are illustrated in

TABLE 1

| Operation Mode | Mode Signal Q1 | Mode Signal Q2 |
|---|---|---|
| 1 | 1 | 1 |
| 2 | 0 | 1 |
| 3 | 1 | 0 |
| 4 | 0 | 0 |

For example, in the first operation mode, the signal-switching circuit 120 electrically connects the transmission signals 1101S of the hardware circuit 1101 to the transmission interface 140. In the second operation mode, the signal-switching circuit 120 electrically connects the transmission signals 1102S of the hardware circuit 1102 to the transmission interface 140. In the third operation mode, the signal-switching circuit 120 electrically connects the transmission signals 1103S of the hardware circuit 1103 to the transmission interface 140. In the second operation mode, the signal-switching circuit 120 electrically connects the transmission signals 1104S of the hardware circuit 1104 to the transmission interface 140.

Specifically, when the signal-switching circuit 120 is in a default status (or an initial status), the data input pin D1 of the DFF 1211 and the data input pin D2 of the DFF 1212 are at the low logic level, and thus the data output pin D1 of the DFF 1211 and the data output pin D2 of the DFF 1212 are at the high logic level, and the inverse data output pin Q1 of the DFF 1211 and the inverse data output pin Q2' of the DFF 1212 are at the low logic level. Meanwhile, the output data pins of the DFFs 1211 and 1212 are at the high logic level. That is, the mode signal can be expressed by (1, 1), or (H, H), thereby controlling the switch circuit 122 to switch to the first operation mode.

When the signal-switching circuit 120 receives the trigger signal for the first time, the data output pin Q1 of the DFF 1211 will be changed to the low logic level from the high logic level, and the inverse data output pin Q1' and the input data pin D1 will be changed to the high logic level from the low logic level. Regarding the DFF 1212, since the signal received by its clock input pin CLK2 is changed to the low logic level from the high logic level indicating a negative-edge-triggered pulse signal, the DFF 1212 is not enabled. Accordingly, the data output pin Q2 of the DFF 1212 is kept at the high logic level and its inverse data output pin Q2' and the data input pin D2 are kept at the low logic level. Meanwhile, the output of the DFF 1211 is at the low logic level and the output of the DFF 1212 is at the high logic level. That is, the mode signal can be expressed by (0, 1) or (L, H), thereby controlling the switch circuit 122 to switch to the second operation mode.

When the signal-switching circuit 120 receives the trigger signal for the second time, the data output pin Q1 of the DFF 1211 will be changed to the high logic level from the low logic level, and the inverse data output pin Q1' and the input data pin D1 will be changed to the low logic level from the high logic level. Regarding the DFF 1212, since the signal received by its clock input pin CLK2 is changed to the high logic level from the low logic level indicating a positive-edge-triggered pulse signal, the DFF 1212 is enabled. Accordingly, the data output pin Q2 of the DFF 1212 is changed to the low logic level from the high logic level, and its inverse data output pin Q2' and the data input pin D2 are changed to the high logic level from the low logic level. Meanwhile, the output of the DFF 1211 is at the high logic level and the output of the DFF 1212 is at the low logic level. That is, the mode signal can be expressed by (1, 0) or (H, L), thereby controlling the switch circuit 122 to switch to the third operation mode.

When the signal-switching circuit 120 receives the trigger signal for the third time, the data output pin Q1 of the DFF 1211 will be changed to the low logic level from the high logic level, and the inverse data output pin Q1' and the input data pin D1 will be changed to the high logic level from the low logic level. Regarding the DFF 1212, since the signal received by its clock input pin CLK2 is changed to the low logic level from the high logic level indicating a negative-edge-triggered pulse signal, the DFF 1212 is not enabled. Accordingly, the data output pin Q2 of the DFF 1212 is kept at the low logic level and its inverse data output pin Q2' and the data input pin D2 are kept at the high logic level. Meanwhile, the output of the DFF 1211 is at the low logic level and the output of the DFF 1212 is at the low logic level. That is, the mode signal can be expressed by (0, 0) or (L, L), thereby controlling the switch circuit 122 to switch to the fourth operation mode.

When the signal-switching circuit 120 receives the trigger signal for the fourth time, the data output pin Q1 of the DFF 1211 will be changed to the high logic level from the low logic level, and the inverse data output pin Q1' and the input data pin D1 will be changed to the low logic level from the high logic level. Regarding the DFF 1212, since the signal received by its clock input pin CLK2 is changed to the high logic level from the low logic level indicating a positive-edge-triggered pulse signal, the DFF 1212 is enabled. Accordingly, the data output pin Q2 of the DFF 1212 is changed to the low logic level from the high logic level and its inverse data output pin Q2' and the data input pin D2 are changed to the high logic level from the low logic level. Meanwhile, the output of the DFF 1211 is at the high logic level and the output of the DFF 1212 is at the high logic level. That is, the mode signal can be expressed by (1, 1) or (H, H), thereby controlling the switch circuit 122 to switch to the first operation mode.

In the embodiment, since the number of DFFs is 2, $2^2$ (i.e., 4) operation modes are supported by the signal-switching circuit 120. After the signal-switching circuit 120 has received the trigger signal four times, the signal-switching circuit 120 will switch to the first operation mode.

Specifically, when the number of DFFs is N in FIG. 2, $2^N$ operation modes are supported by the signal-switching circuit 120, and the operation mechanism of the DFFs 1211~121N are similar to that described in the embodiment of FIG. 4, and thus the details will be omitted here.

Figure 5:
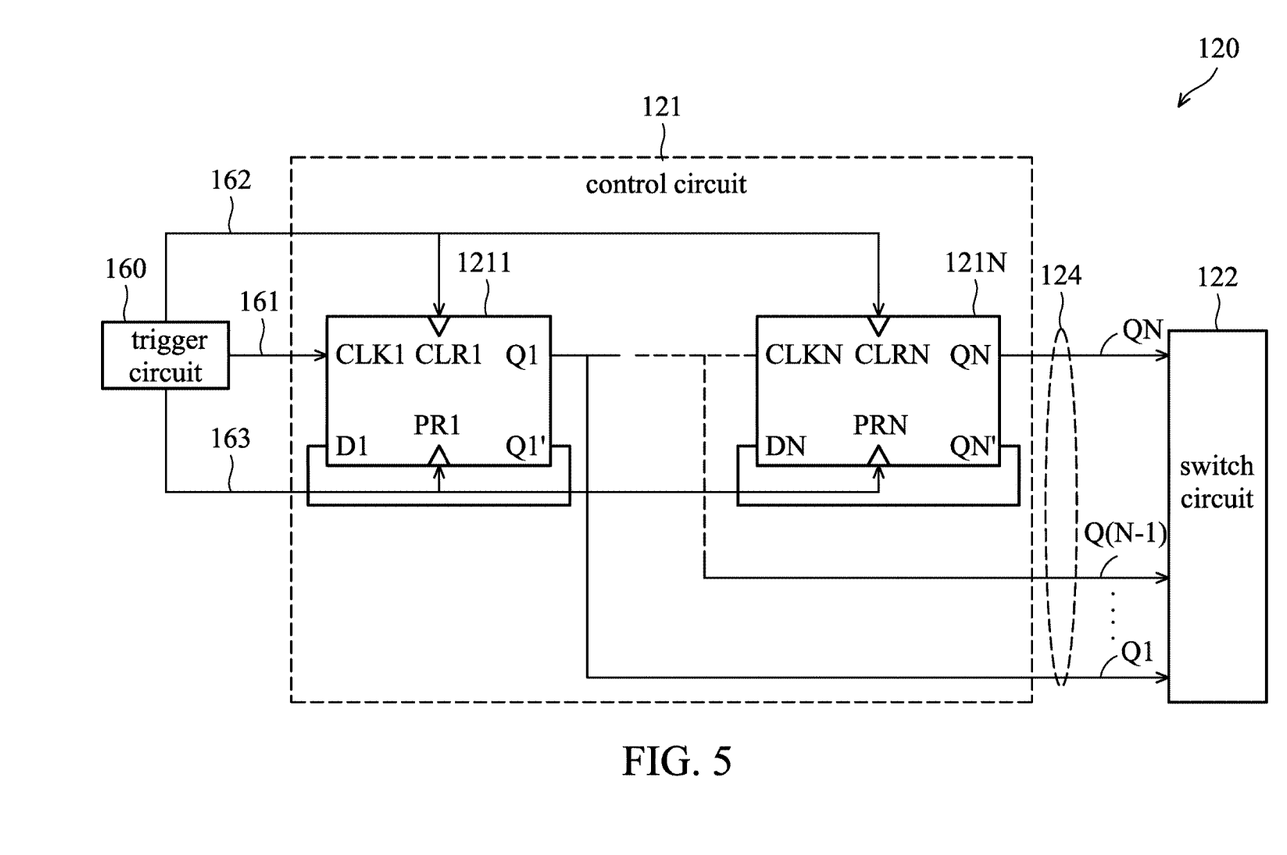
FIG. 5 is a schematic block diagram of the signal-switching circuit in accordance with another embodiment of the invention.

FIG. 5 is a schematic block diagram of the signal-switching circuit in accordance with another embodiment of the invention. In another embodiment, the DFFs 1211~121N of the signal-switching circuit 120 may be positive-edge-triggered DFFs or negative-edge-triggered DFFs having clear pins (e.g., CLR1~CLRN) and preset pins (e.g., PR1~PRN). For example, the clear pin and preset pin of each DFF may be low-active asynchronous control signal. In an embodiment, the trigger circuit 160 may send a clear signal 162 to the clear pin (e.g., CLR1~CLRN) of each of the DFFs 1211~121N, and send a preset signal 163 to the preset pin (e.g., PR1~PRN) of each of the DFFs 1211~121N, thereby directly controlling the statuses of the DFFs 1211~121N using the asynchronous clear and preset signals.

If the clear pins CLR and the preset pins PR of the DFFs 1211~121N are at the high logic level, the behaviors of the DFFs 1211~121N in FIG. 5 are the same with those of the DFFs 1211~121N in FIG. 3. When the clock input pin CLK receives a positive-edge trigger signal, the logic level of the data output pins Q1~QN will be set to that of the input data pins D1~DN.

If the clear pins CLR of the DFFs 1211~121N are at the high logic level and the preset pins of the DFFs 1211~121N are at the low logic level, the data output pins Q1~QN of the DFFs 1211~121N will be forced to be set at the high logic level and the inverse data output pin Q1'~QN' are at the low logic level.

If the clear pins CLR of the DFFs 1211~121N are at the low logic level and the preset pins of the DFFs 1211~121N are at the high logic level, the data output pins Q1~QN will be forced to be set at the low logic level and the inverse data output pins Q1'~QN' are at the high logic level.

If the clear pins and the preset pins of the DFFs 1211~121N are at the low logic level, the data output pins Q1~QN may be a race condition with the respective inverse data output pins Q1'~QN'. Generally, during the design phase, setting both the clear pin and the preset pin of each of the DFFs 1211~121N to the low logic level is avoided.

Specifically, in an embodiment, one of the operation modes may be used frequently. Since the clear signal 162 and the preset signal 163 are asynchronous signals, the designer or user may set the clear pins of the DFFs 1211~121N to the low logic level and the preset pins of the DFFs 1211~121N to the high logic level using the clear signal 162 and the preset signal 163 no matter which operation mode the signal-switching circuit is currently in. Meanwhile, the operation mode corresponding to the mode signal (e.g., all 1s) in this situation is defined as the default operation mode.

In another embodiment, the designer or user may set the clear pins of the DFFs 1211~121N to the high logic level and the preset pins of the DFFs 1211~121N to the low logic level using the clear signal 162 and the preset signal 163 no matter which operation mode the signal-switching circuit is currently in. Meanwhile, the operation mode corresponding to the mode signal (e.g., all 0s) in this situation is defined as the default operation mode.

In yet another embodiment, the logic levels of the clear pin CLR and the preset pin PR of each of the DFFs 1211~121N can be respectively defined. For example, a respective switch circuit (not shown) in the trigger circuit 160 can be used to separately set the logic levels of the clear pin CLR and the preset pin PR of each of the DFFs 1211~121N. That is, the logic levels of the clear pin CLR and the preset pin PR of each of the DFFs 1211~121N can be controlled independently. Accordingly, the signal-switching circuit 120 can be set to a specific operation mode at the initial status or during the sequential switching procedure between the operation modes.

Figure 6:
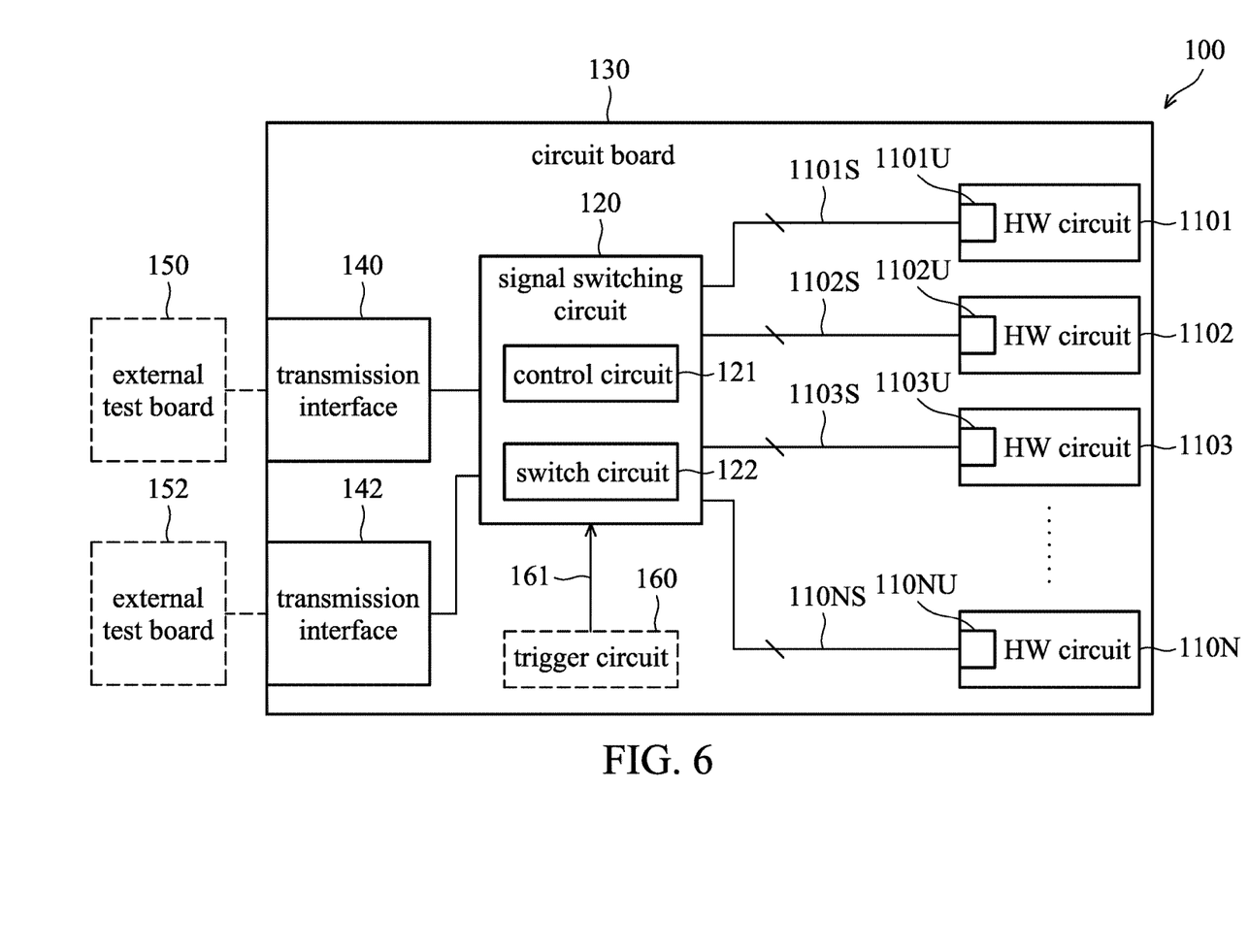
FIG. 6 is a schematic block diagram of the electronic system in accordance with another embodiment of the invention.

FIG. 6 is a schematic block diagram of the electronic system in accordance with another embodiment of the invention. In another embodiment, the electronic system 100 further includes a transmission interface 142, and the signal-switching circuit 120 may output a respective set of transmission signals via the transmission interface 140 and the transmission interface 142. For example, in some operation modes, the signal-switching circuit 120 may select two sets of the transmission signals from the hardware circuit 1101~110N such as selecting the transmission signals 1101S from the hardware circuit 1101 and the transmission signals 1103S from the hardware circuit 1103. The transmission signals 1101S are transmitted to the external test board 150 via the transmission interface 140, and the transmission signals 1103S are transmitted to the external test board 152 via the transmission interface 142.

It should be noted that the switching of operation modes of the signal-switching circuit 120 is still controlled by the trigger signal 161 generated by the trigger circuit 160, and can be implemented by the signal-switching circuit 120 described in the embodiments of FIG. 3 or FIG. 5. If the number of operation modes is larger than that of the hardware circuits 1101~110N, the same two hardware circuits can be selected in some operation modes and respectively connected to the transmission interfaces 140 and 142.

In view of the above, a signal-switching circuit is provided in the embodiments of the invention. The signal-switching circuit is capable of switching between more than two operation modes using a trigger signal (i.e., a 1-bit signal) generated by a hardware trigger circuit, and no software is used. Accordingly, the problems for switching between operation modes using the software can be prevented, and the design phase and cost of the electronic system can be reduced, and the performance of the software can also be enhanced.

While the invention has been described by way of example and in terms of the preferred embodiments, it should be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A signal-switching circuit for use in an electronic system, wherein the electronic system comprises a plurality of hardware circuits, the signal-switching circuit comprising:
a control circuit, arranged to receive a trigger signal generated by a trigger circuit of the electronic system, and change a mode signal generated by the control circuit in response to the trigger signal; and
a switch circuit, arranged to electrically connect transmission signals from one of the hardware circuits to a test board external to the electronic system via a transmission interface of the electronic system in response to the mode signal,
wherein the trigger signal is a pulse signal,
wherein the signal-switching circuit comprises more than two operation modes, and the control circuit changes the mode signal according to the trigger signal to sequentially switch between the operation modes,
wherein the control circuit includes N serially-connected D flip-flops (DFFs), and each of the N DFFs comprises a data input pin, a clock input pin, a data output pin, and an inverse data output pin, and the inverse data output pin is connected to the data input pin in each of the N DFFs,
wherein the clock input pin of the first DFF of the N DFFs receives the trigger signal,
wherein the data output pin of each DFF is connected to the block input pin of the next DFF for each of the first DFF to the (N−1)-th DFF,
wherein the data output pin of each of the N DFFs is connected to the switch circuit.

2. The signal-switching circuit as claimed in claim 1, wherein the hardware circuits are system-on-chips (SoCs).

3. The signal-switching circuit as claimed in claim 1, wherein an output signal from the data output pin of each of the N DFFs forms the mode signal.

4. The signal-switching circuit as claimed in claim 1, wherein the N DFFs are positive-edge-triggered DFF.

5. The signal-switching circuit as claimed in claim 1, wherein the N DFFs are negative-edge-triggered DFF.

6. The signal-switching circuit as claimed in claim 3, wherein each of the N DFFs comprises a clear pin and a preset pin, and when the signal-switching circuit receives a set signal to set the clear pin of each of the N DFFs at the high logic level and the preset pin of each of the N DFFs at the low logic level, the data output pin of each of the N DFFs is set to the high logic level, and the switch circuit switches to one of the operation modes corresponding to the mode signal.

7. The signal-switching circuit as claimed in claim 3, wherein each of the N DFFs comprises a clear pin and a preset pin, and when the signal-switching circuit receives a set signal to set the clear pin of each of the N DFFs at the low logic level and the preset pin of each of the N DFFs at the high logic level, the data output pin of each of the N DFFs is set to the low logic level, and the switch circuit switches to one of the operation modes corresponding to the mode signal.

8. An electronic system, comprising:
   a plurality of hardware circuits;
   a trigger circuit, arranged for generating a trigger signal;
   a transmission interface; and
   a signal-switching circuit, comprising:
      a control circuit, arranged to receive a trigger signal generated by a trigger circuit of the electronic system, and change a mode signal generated by the control circuit in response to the trigger signal; and
      a switch circuit, arranged to electrically connect transmission signals from one of the hardware circuits to a test board external to the electronic system via a transmission interface of the electronic system in response to the mode signal,
   wherein the trigger signal is a pulse signal,
   wherein the signal-switching circuit comprises more than two operation modes, and the control circuit changes the mode signal according to the trigger signal to sequentially switch between the operation modes,
   wherein the control circuit includes N serially-connected D flip-flops (DFFs), and each of the N DFFs comprises a data input pin, a clock input pin, a data output pin, and an inverse data output pin, and the inverse data output pin is connected to the data input pin in each of the N DFFs,
   wherein the clock input pin of the first DFF of the N DFFs receives the trigger signal,
   wherein the data output pin of each DFF is connected to the block input pin of the next DFF for each of the first DFF to the (N−1)-th DFF,
   wherein the data output pin of each of the N DFFs is connected to the switch circuit.

* * * * *